United States Patent
Hausdorf et al.

(10) Patent No.: US 7,907,923 B2
(45) Date of Patent: Mar. 15, 2011

(54) METHOD AND APPARATUS FOR SQUELCH GATING A RECEIVING SIGNAL

(75) Inventors: Reiner Hausdorf, Ottobrunn (DE); Leo Brueckner, Prstice (CZ)

(73) Assignee: Rohde & Schwarz GmbH & Co. KG, Müchen (DE)

(*) Notice: Subject to any disclaimer, the term of this patent is extended or adjusted under 35 U.S.C. 154(b) by 823 days.

(21) Appl. No.: 11/694,433

(22) Filed: Mar. 30, 2007

(65) Prior Publication Data

US 2007/0275685 A1 Nov. 29, 2007

(30) Foreign Application Priority Data

Apr. 7, 2006 (EP) .................................... 06007405
Jan. 4, 2007 (EP) .................................... 07000145

(51) Int. Cl.
*H04B 1/10* (2006.01)

(52) U.S. Cl. .................. 455/212; 455/114.2; 455/174.1; 375/285; 375/351; 381/94.5

(58) Field of Classification Search .................. 455/424, 455/425, 456.5, 456.6, 561, 550.1, 575.1, 455/501, 63.1, 67.13, 701, 114.2, 174.1, 455/212, 218, 223, 222, 242.1, 242.2, 278.1, 455/283, 296; 381/13, 15, 317, 83, 318, 381/94.5, 94.1; 375/217, 351, 144, 148, 375/254, 284, 285, 346, 287, 283, 350

See application file for complete search history.

(56) References Cited

U.S. PATENT DOCUMENTS

| | | | | |
|---|---|---|---|---|
| 3,873,926 A | * | 3/1975 | Wright ........................... | 455/225 |
| 3,904,969 A | * | 9/1975 | Eastmond ..................... | 455/221 |
| 3,927,376 A | * | 12/1975 | Ferrie .......................... | 375/217 |
| 3,949,301 A | * | 4/1976 | Mattei .......................... | 455/212 |
| 3,978,412 A | * | 8/1976 | Frerking ....................... | 455/222 |
| 3,979,679 A | * | 9/1976 | Bush et al. ................... | 455/213 |
| 4,041,390 A | * | 8/1977 | Schroeder ...................... | 455/83 |
| 4,153,878 A | * | 5/1979 | Osborn ......................... | 455/221 |
| 4,154,980 A | * | 5/1979 | Schmidt et al. ................ | 381/13 |
| 4,479,252 A | * | 10/1984 | Souchay et al. .............. | 455/223 |
| 4,724,545 A | * | 2/1988 | Hamada ........................ | 455/218 |
| 5,151,922 A | * | 9/1992 | Weiss ............................. | 375/217 |
| 5,303,408 A | * | 4/1994 | Ghomeshi et al. ............ | 455/222 |
| 5,675,614 A | * | 10/1997 | Wetters ........................ | 375/351 |
| 5,734,976 A | * | 3/1998 | Bartschi et al. .............. | 455/333 |
| 6,047,170 A | | 4/2000 | Paulsen et al. | |
| 6,208,848 B1 | * | 3/2001 | Bertrana ....................... | 455/218 |

(Continued)

FOREIGN PATENT DOCUMENTS

DE  196 10 455  10/1997

(Continued)

*Primary Examiner* — Duc Nguyen
*Assistant Examiner* — Charles Chow
(74) *Attorney, Agent, or Firm* — Marshall, Gerstein & Borun LLP

(57) ABSTRACT

A method and an apparatus for squelch gating a receiving signal depending on the level of phase noise in said receiving signal determines sampled amplitudes and sampled phases of said receiving signal, determines sampled phase noise by differentiating subsequent sampled phases, determines a squelch signal by rectifying and averaging said sampled phase noise, determines a start point of gating after a rising of said squelch signal above a higher threshold delayed by a first delay time, determines a end point of gating after a dropping of said squelch signal below a lower threshold delayed by a second delay time and gates said sampled amplitudes from said start point of gating until said end point of gating.

5 Claims, 9 Drawing Sheets

U.S. PATENT DOCUMENTS

| | | | |
|---|---|---|---|
| 6,347,146 B1 * | 2/2002 | Short et al. | 381/15 |
| 6,397,050 B1 * | 5/2002 | Peterson et al. | 455/221 |
| 2001/0044289 A1 * | 11/2001 | Tsuji et al. | 455/296 |
| 2003/0114126 A1 | 6/2003 | Wang et al. | 455/234.2 |
| 2003/0219085 A1 | 11/2003 | Endres et al. | 375/350 |

FOREIGN PATENT DOCUMENTS

| | | |
|---|---|---|
| DE | 199 37 199 | 2/2001 |
| WO | WO 2004/038953 | 5/2004 |

* cited by examiner

METHOD AND APPARATUS FOR SQUELCH GATING A RECEIVING SIGNAL

BACKGROUND OF THE INVENTION

1. Field of the Invention

The invention relates to an apparatus and a method for squelch gating a receiving signal.

2. Related Technology

In digital receivers the possibility to mute an audio output signal in case of disappearance of the carrier of the received audio signal or in case of a drop of the signal-noise-ratio in the received audio signal below a threshold is known from U.S. Pat. No. 6,047,170 A.

The technical realization for determining the measure of noise in a received signal is called squelch and is based on the continuous measuring of phase noise in the audio signal and the gating of the demodulated audio signal according the measured level of phase noise in comparison with specified thresholds.

FIG. 1 shows an apparatus for gating a received audio signal on the basis of a squelch signal characterizing the measure of phase noise in the audio signal.

The received sampled RF audio signal $x_n$ with its sampled cartesian components—sampled real component $Re\{x_n\}$ and sampled imaginary component $Im\{x_n\}$—is converted in a Cordic-unit 1 to its polar components, sampled amplitude $m_n$ and sampled phase $\phi_n$. In a differentiating unit 3 of a squelch detector 3 a sampled phase difference $\Delta\phi_n$ between a sampled phase $\phi_n$ and its succeeding sampled phase $\phi_{n-1}$—determined in a delay unit 4 of the differentiating unit 3 on the basis of the sampled phase $\phi_{n-1}$—is determined in subtracting unit 5 of the differentiating unit 3.

The sampled phase difference $\Delta\phi_n$ contains signal portions of low frequency, caused by frequency offset or frequency drift of the carrier in the received RF audio signal, and phase noise as signal portions of high frequency. To eliminate the signal portions of low frequency in the sampled phase difference $\Delta\phi_n$ a subsequent highpass filter 6 of the squelch detector 2—typically a 4th order IIR highpass filter—produces sampled phase differences $\Delta\phi_n$ comprising only phase noise relevant signal portions.

The signed sampled phase differences $\Delta\phi_n$ corresponding to phase noise are rectified in a subsequent squaring unit 7. The squaring unit 7 can alternatively be replaced by a device performing the absolute value of its input signal. For averaging the sampled unsigned RF phase differences $p_n$ over time a digital filter 8 having a proportional-integral characteristic concerning equation (1) represents the last signal processing unit of the squelch detector 2 delivering the sampled squelch signal $s_n$ at its output. In equation (1) $f_s$ represents the sampling rate and $\tau$ represents the time constant of the integral characteristic of the digital filter 8.

$$s_n = s_{n-1} + \frac{f_s}{\tau} \cdot (p_n - s_{n-1}) \quad (1)$$

The sampled amplitudes $m_n$ of the RF receiving audio signal $x_n$ are demodulated in a demodulator 9. The demodulated audio signal $y_n$ is gated in a subsequent gating unit 10 on the basis of the determined sampled squelch signal $s_n$ and a specified threshold delivering a muted audio signal $a_n$ to the outputting unit 11.

In an off→on→off-cycle of an audio transmission FIG. 2 displays the DC component of the carrier $DC(m_n)$ (curve 40), the rectified RF phase noise $p_n$ (curve 20) and the squelch signal $s_n$ (curve 30) in the apparatus for gating a received audio signal according to FIG. 1, whereby the time constant $\tau$ of the integrating digital filter 8 ms is 5 ms.

The time constant of the digital filter is typically between 5 ms and 10 ms. Thus random peaks in the RF phase noise $p_n$ being shorter than 5 ms to 10 ms are not averaged by means of the digital filter 8 with proportional-digital characteristic leading to a squelch signal $s_n$ with random peaks. Such peaks in the squelch signal $s_n$ drops below respectively rises above the specified threshold(s) and disadvantageously mutes the received audio signal for a short period. Especially in case of a squelch signal $s_n$ rising above respectively dropping below a specified threshold leading to switch off respectively switch on of the received audio signal random peaks in the squelch signal $s_n$ occurring shortly after the switch reverses the switch of the received audio signal.

Prolongation of the time constant $\tau$ of the integrating digital filter 8 for avoiding such unwanted reversals of switches in the audio signal in case of peaks in the squelch signal would deteriorate the time behavior of the integrating digital filter and thus the time behavior of the squelch detector. The worse reaction of the integrating digital filter would undesirably delay the squelch signal $s_n$ in comparison with an on→off-step or an off→on-step of the carrier in the audio transmission (see in FIG. 2 the delay of the squelch signal $s_n$ (curve 20) in comparison with an off→on-step of the DC component of the carrier $DC(m_n)$ (curve 40)).

SUMMARY OF THE INVENTION

The invention provides an apparatus and a method for squelch gating a received audio signal and thereby avoiding the occurrence of short-time reversal of the audio signal's switching without deteriorating the time behavior of the squelch detector.

The invention provides a method for squelch gating a receiving signal depending on the level of phase noise in the receiving signal comprising following steps: determining sampled amplitudes and sampled phases of the receiving signal, determining sampled phase noise by differentiating subsequent sampled phases, determining a squelch signal by rectifying and averaging the sampled phase noise, determining a start point of gating after a rising of the squelch signal above a higher threshold delayed by a first delay time, determining an end point of gating after a dropping of the squelch signal below a lower threshold delayed by a second delay time, and gating the sampled amplitudes from the start point of gating until the end point of gating.

The invention also provides an apparatus for squelch gating a receiving signal depending on the value of phase noise in the receiving signal including a unit for determining sampled amplitudes and sampled phases of the receiving signal, a unit for determining sampled phase noise by differentiating subsequent sampled phases, a unit for determining a squelch signal by rectifying and averaging the sampled phase noise, and a switching unit for gating the sampled amplitudes from a rising of the squelch signal above a higher threshold delayed by a first delay time until a dropping of the squelch signal below a lower threshold delayed by a second delay time.

BRIEF DESCRIPTION OF THE DRAWINGS

An embodiment of the inventive apparatus and four embodiments of the inventive method for gating a receiving signal are described in detail with reference to the drawings. The figures of the drawings show.

DETAILED DESCRIPTION

Figure 1:
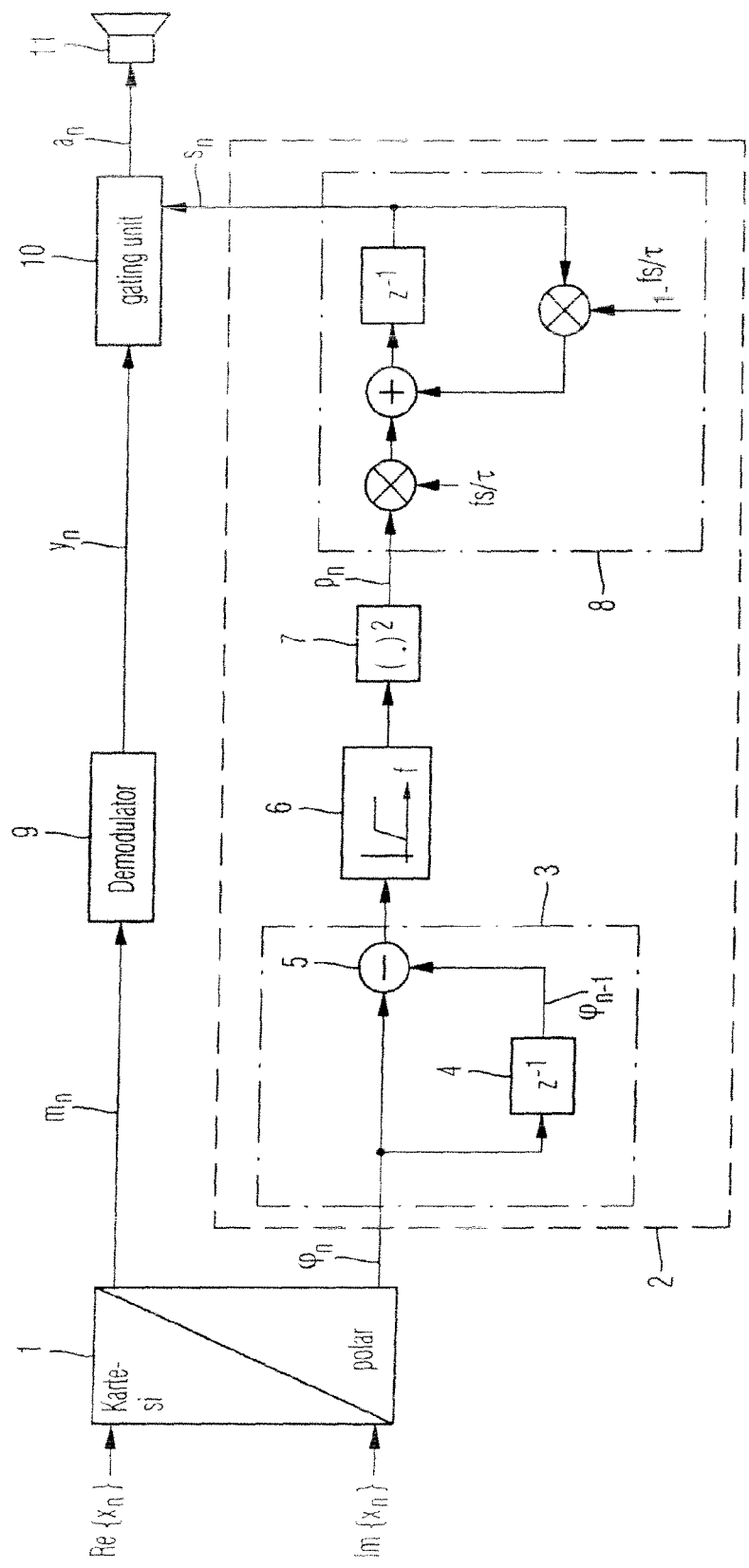
FIG. 1 is a block diagram of an apparatus for gating a receiving signal.
Figure 2:
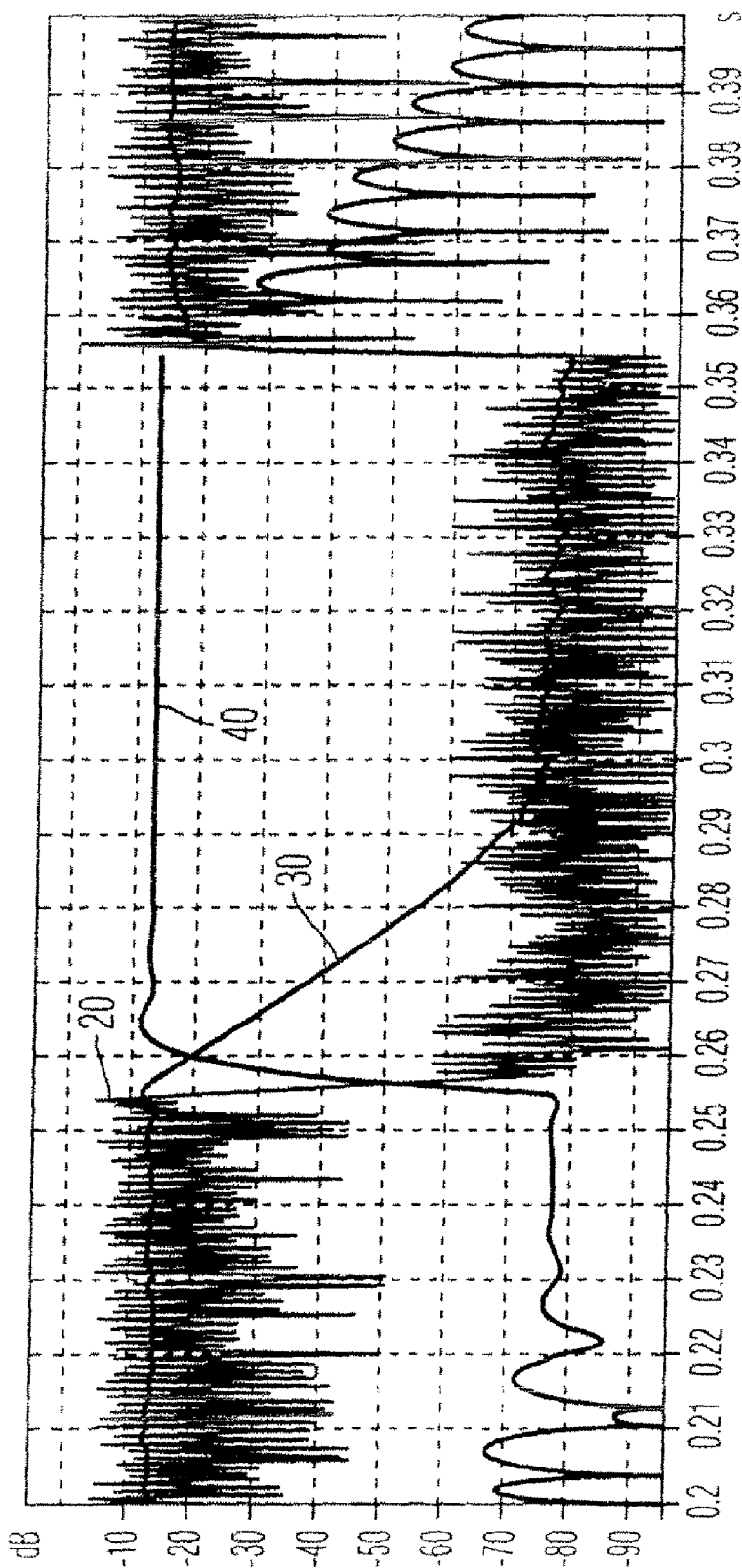
FIG. 2 is a time diagram of RF phase noise, of squelch signal and of DC component of the carrier in an apparatus for gating a receiving signal according to FIG. 1.

According to the invention, the start point of gating the audio signal is the time point when the squelch signal $s_n$ rises above the higher threshold delayed by a first delay time. The end point of gating the audio signal is the time point, when the squelch signal $s_n$ drops below the lower threshold delayed by a second delay time. Therefore short-time reversal of switching the audio signal in case of occurrence of peaks in the squelch signal shortly after switching the audio signal can be advantageously prohibited.

In a first embodiment of the inventive method a third delay time for delaying the sampled amplitudes $m_n$ of the audio signal at the start point of gating and a fourth delay time for delaying the sampled amplitudes $m_n$ of the audio signal at the end point of gating is calculated to compensate the unwanted delay in the muting of the demodulated audio signal $y_n$ caused by the first delay time at the start point of gating or by the second delay time at the end point of gating, respectively.

A delaying of the sampled amplitudes $m_n$ of the audio signal by different delay times—third delay time at the beginning of gating, fourth delay time at the end of gating—can not be realized. Thus the maximum delay time of the third and fourth delay time is chosen for delaying the sampled amplitudes $m_n$ of the audio signal both at the start and at the end of gating. The selection of one of the third or fourth delay time for delaying the sampled amplitudes $m_n$ of the audio signal leads to a failure in the correct time point either for starting or for ending the gating. To eliminate this failure at one of the two time points both the first and the second delay time are recalculated by the chosen maximum delay time for delaying the sampled amplitudes $m_n$ of the audio signal.

For avoiding the delay between the squelch signal $s_n$ and the demodulated audio signal $y_n$ caused by the time constant τ of the integrating digital filter 8 the user of the receiver or an automatic selection unit can select a first time interval $\Delta t_{sp}$ relative to the original start point of gating—the time point, when the squelch signal $s_n$ rises above the higher threshold delayed by the first delay time—for determining a new start point of gating and a second time interval $\Delta t_{ep}$ relative to the original end point of gating—the time point, when the squelch signal $s_n$ drops below the lower threshold delayed by the second delay time—for determining a new end point of gating. The new start point of gating and the new end point of gating is determined empirically by the user or the automatic selection unit changing the first time interval $\Delta t_{sp}$ or the second time interval $\Delta t_{ep}$, until phase noise disappears at the beginning or at the end, respectively, of the audio receiving.

In a second embodiment of the inventive method a third delay time for delaying the sampled amplitudes $m_n$ of the audio signal at the start point of gating is calculated as the difference of the original start point of gating and the new start point of gating being the summation of the first delay time and the first time interval $\Delta t_{sp}$ relative to the original start point of gating. Consequently a fourth delay time for delaying the sampled amplitudes $m_n$ of the audio signal at the end point of gating is calculated as the difference of the original end point of gating and the new end point of gating being the summation of the second delay time and the second time interval $\Delta t_{ep}$ relative to the original end point of gating.

To eliminate the failure caused by delaying the sampled amplitudes $m_n$ of the audio signal both at the beginning and also at the end of gating both the first and the second delay time are recalculated each by subtracting the first time interval $\Delta t_{sp}$ or the second time interval $\Delta t_{ep}$, respectively, from the chosen maximum delay time for delaying the sampled amplitudes $m_n$ of the audio signal.

For avoiding unwanted clicks at the beginning and/or at the end of audio transmission the gating is continuously increased from an inactive gating level up to an active gating level during a first fading time $T_{fade1}$ at the beginning of gating and is continuously decreased from an active gating level down to an inactive gating level during a second fading time $T_{fade2}$ at the end of gating. In a third embodiment of the inventive method the start point of gating is the start point of fading from the inactive level and the end point of gating is the start point of fading from the active gating level. In a fourth embodiment of the inventive method the start point of gating is the end point of fading at the active gating level and the end point of gating is the end point of fading at the inactive gating level.

Optionally for reducing the delay between the squelch signal $s_n$ and an on→off-step or an off→on-step of the carrier signal in the audio transmission the value of said squelch signal $s_n$ is changed to the value of the higher threshold in case of a rising squelch signal $s_n$ being below the higher threshold and the value of said squelch signal $s_n$ is changed to the value of the lower threshold in case of a dropping squelch signal $s_n$ being above the lower threshold.

The inventive apparatus and the inventive method for gating a receiving signal are described below with reference to FIGS. 3 and 4 of the drawings:

In the first step S10 of the inventive method for gating a receiving signal the sampled amplitudes $m_n$ and sampled phase $\phi_n$ of the sampled receiving audio signal $x_n$ are determined in an converter 1—typically a Cordic-unit—on the basis of the sampled real component Re$\{x_n\}$ and the sampled imaginary component Im$\{x_n\}$ of the complex receiving audio signal $x_n$.

In the following step S20 of the inventive method sampled rectified phase noise $p_n$ is determined on the basis of the sample phases $\phi_n$. Firstly the phase difference $\Delta\phi_n$ between a sampled phase $\phi_n$ and its succeeding sampled phase $\phi_{n-1}$ is determined for each sampling point in a differentiating unit 3. Secondly the low frequency signal portions of the phase difference $\Delta\phi_n$—caused by frequency offset and frequency drift of the carrier signal—are eliminated in a 4th order highpass filter 6 to obtain a phase difference $\Delta\phi_n$ comprising only high frequency signal portions being phase noise $p_n$. In a squaring unit 7 the phase noise $p_n$ is rectified. Alternatively the rectifying of the phase noise $p_n$ can be performed by means of a absolute value performing unit.

In the next step S30 of the inventive method the squelch signal $s_n$ is determined by averaging the rectified phase noise $p_n$ in a digital filter 9 with proportional-integral characteristic.

Figure 13:
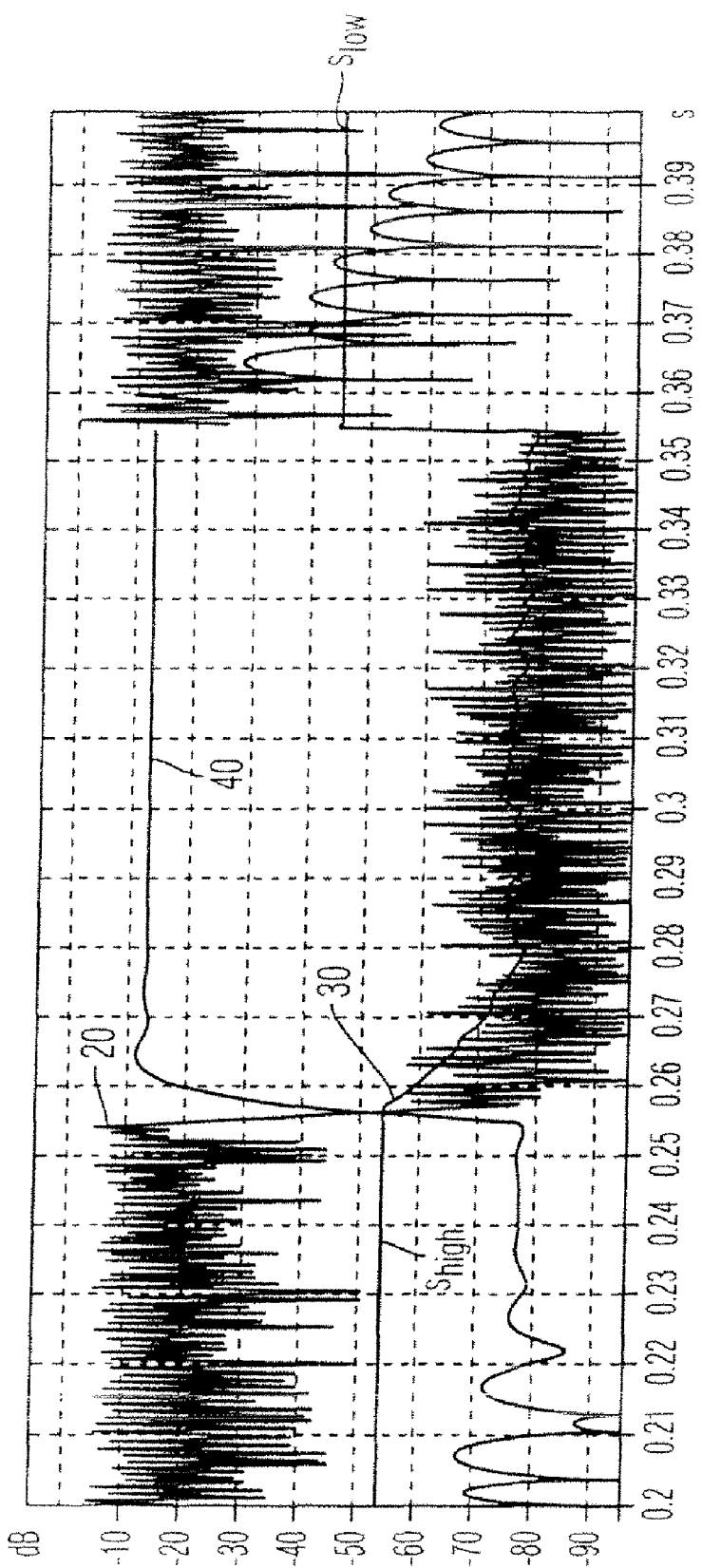
FIG. 13 is a time diagram of RF phase noise, of squelch signal and of DC component of the carrier in an inventive apparatus for gating a receiving signal.

Optionally in case of a rising squelch signal $s_n$ being below a selected higher threshold $S_{high}$ the value of the squelch signal $s_n$ is changed to the higher threshold $S_{high}$ according to FIG. 13 in a gating unit 10. Consequently in case of a dropping squelch signal $s_n$ being higher a selected lower threshold $S_{low}$ the value of the squelch signal $s_n$ is changed to the lower threshold $S_{low}$ according to FIG. 13 in the gate unit 10. By these means the time for starting or for ending the gating, respectively is thus reduced.

The following step S40 of the inventive method comprises the determination of the start point and of the end point of gating.

Figure 5:
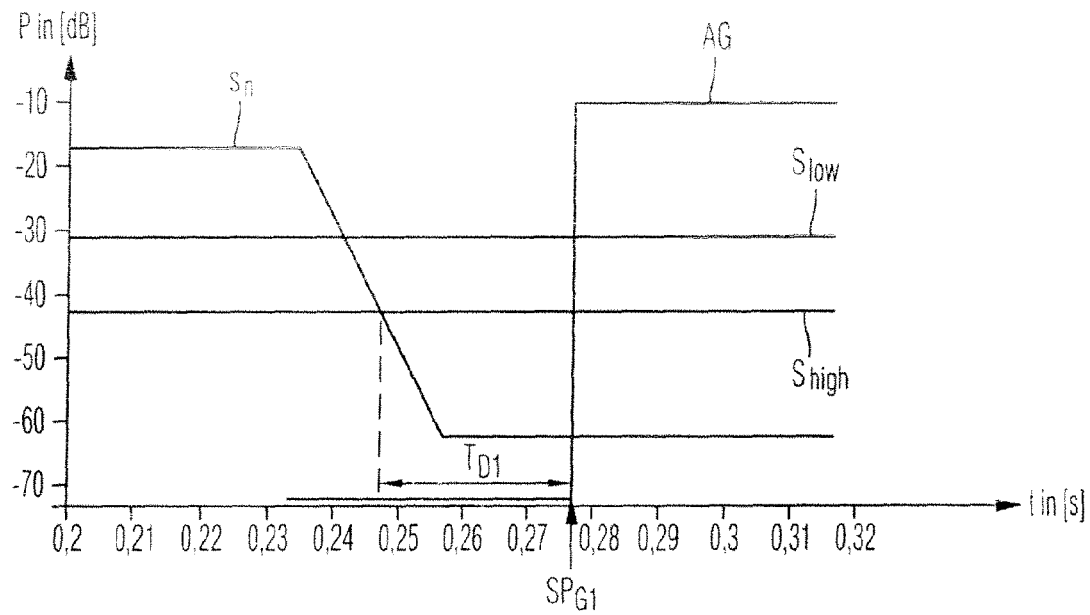
FIG. 5 is a time diagram of starting a gating of a receiving signal in a first embodiment of the invention.

In a gating unit 11 the squelch signal $s_n$ is compared with a selected higher threshold $S_{high}$ in case of a rising of the squelch signal $s_n$. The start point $SP_{G1}$ of gating in a first embodiment of the invention occurs according to FIG. 5, when the squelch signal $s_n$ rises above the higher threshold $S_{high}$ and a subsequent first delay time $T_{D1}$ expires. The starting of gating is characterized by the rising audio gate signal AG—the control signal for gating the amplitudes $m_n$ of the received audio signal in the gating unit 10—in FIG. 5.

Figure 6:
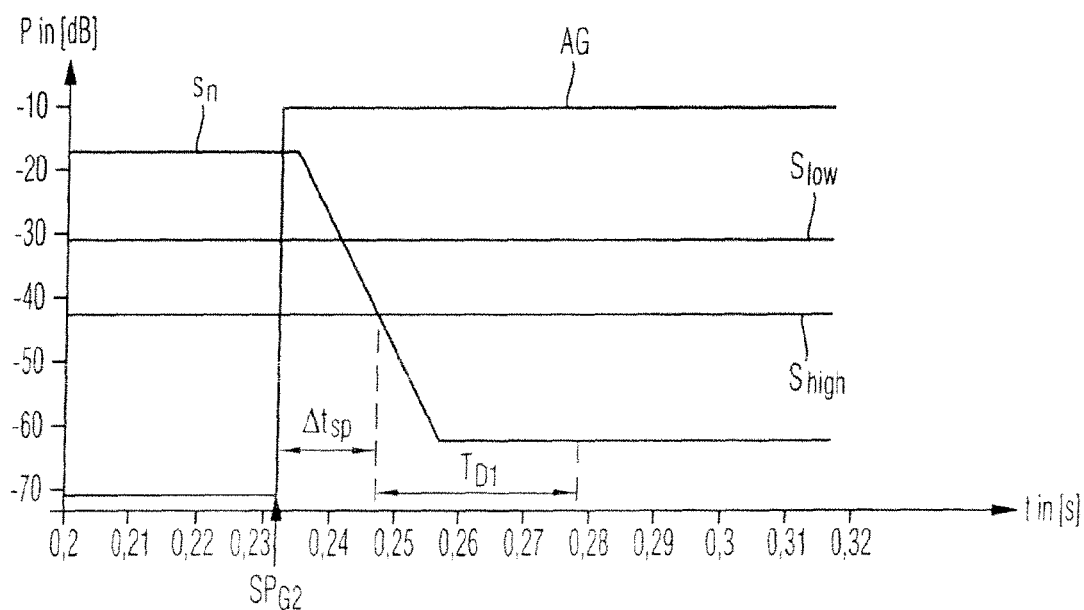
FIG. 6 is a time diagram of starting a gating of a receiving signal in a second embodiment of the invention.

In a second embodiment of the invention the user of the receiver determines the start point $SP_{G2}$ of gating by adjusting the start point $SP_{G1}$ of gating of the first embodiment of invention, until phase noise disappears at the beginning of gating. The start point $SP_{G2}$ of the second embodiment of the invention corresponds to an adjustment of the start point $SP_{G1}$ of gating of the first embodiment of invention in the size of a first time interval $\Delta t_{sp}$ according to FIG. 6. The adjustment in the size of a first time interval $\Delta t_{sp}$ can be performed in both directions relative to the start point $SP_{G1}$ of gating of the first embodiment of invention.

Figure 7:
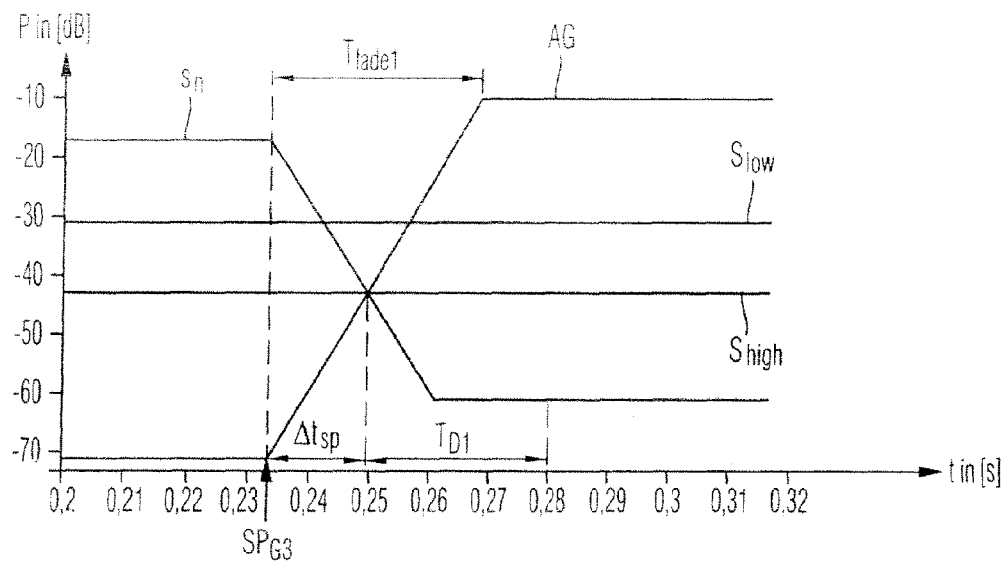
FIG. 7 is a time diagram of starting a gating of a receiving signal in a third embodiment of the invention.

In a third embodiment of the invention the gating is started from zero up to an active gating level inside a first fading time $T_{fade1}$. Defining the start of fading as the start point of gating the start point $SP_{G3}$ of the third embodiment of the invention corresponds to the start point $SP_{G2}$ of gating of the second embodiment of invention according to FIG. 7.

Figure 8:
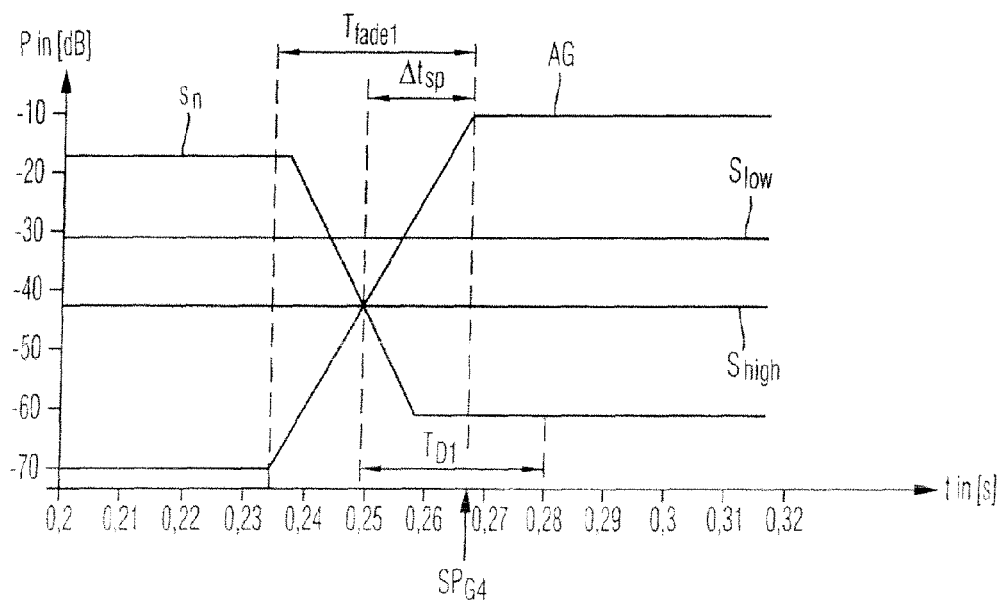
FIG. 8 is a time diagram of starting a gating of a receiving signal in a fourth embodiment of the invention.

In a fourth embodiment of the invention the end of fading defines the start point of gating leading to a start point $SP_{G4}$ of the fourth embodiment of the invention according to FIG. 8.

Figure 9:
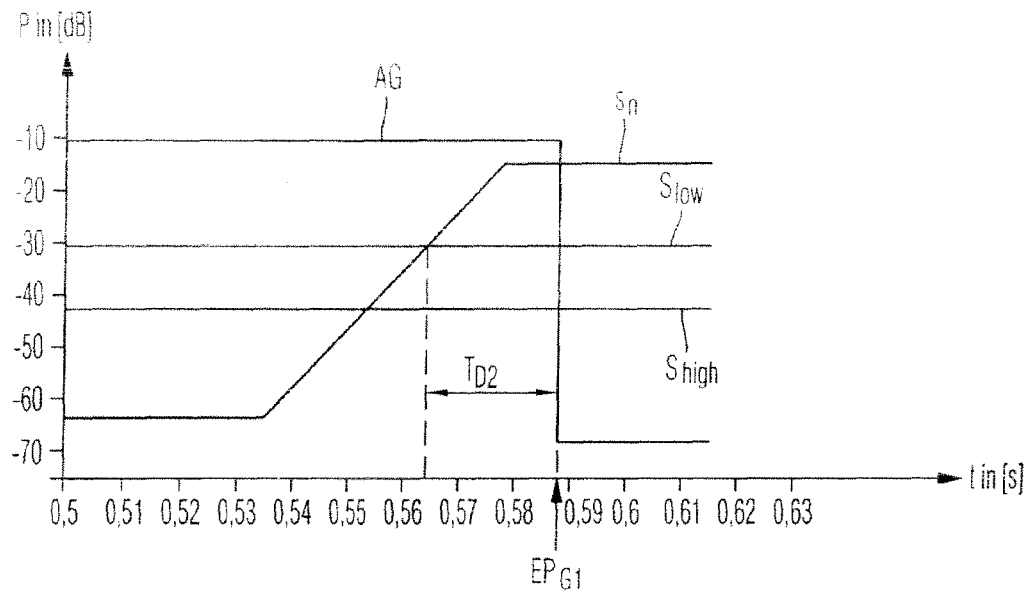
FIG. 9 is a time diagram of ending a gating of a receiving signal in a first embodiment of the invention.

For determining the end point of gating the dropping squelch signal $s_n$ is compared with a selected lower threshold $S_{low}$ in the gating unit 10. The end point $EP_{G1}$ of gating of the first embodiment of the invention occurs according to FIG. 9, when the squelch signal $s_n$ drops below the lower threshold $S_{low}$ and a subsequent second delay time $T_{D2}$ expires. The ending of gating is characterized by the dropping audio gate signal AG in FIG. 9.

Figure 10:
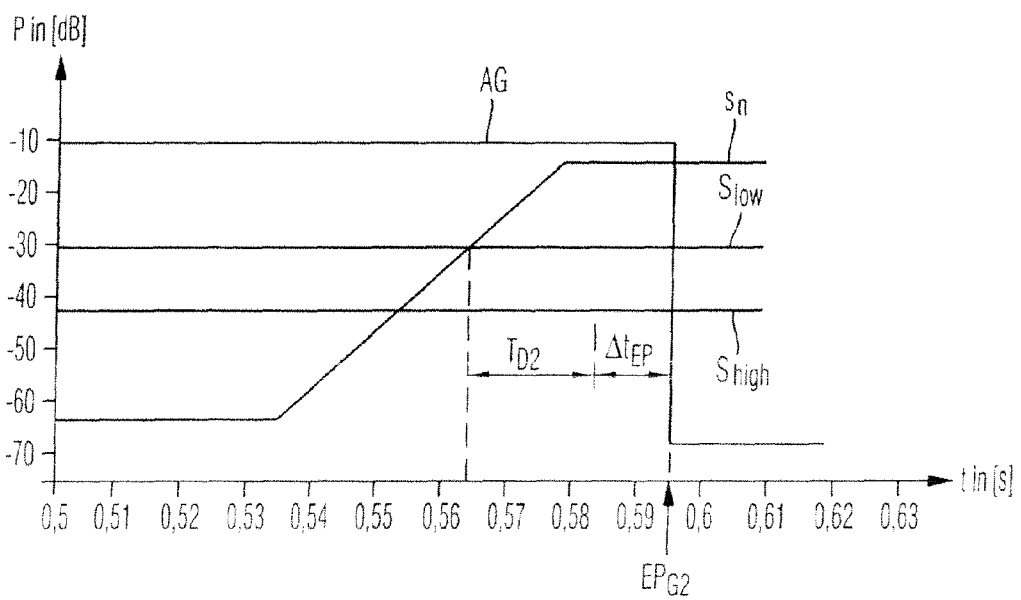
FIG. 10 is a time diagram of ending a gating of a receiving signal in a second embodiment of the invention.

In the second embodiment of the invention the end point $EP_{G2}$ of gating is determined by adjusting the end point $EP_{G1}$ of gating of the first embodiment of the invention, until the phase noise disappears at the end of gating. The end point $EP_{G2}$ of the second embodiment of the invention corresponds to an adjustment of the end point $EP_{G1}$ of gating of the first embodiment of invention in the size of a second time interval $\Delta t_{ep}$ according to FIG. 10.

Figure 11:
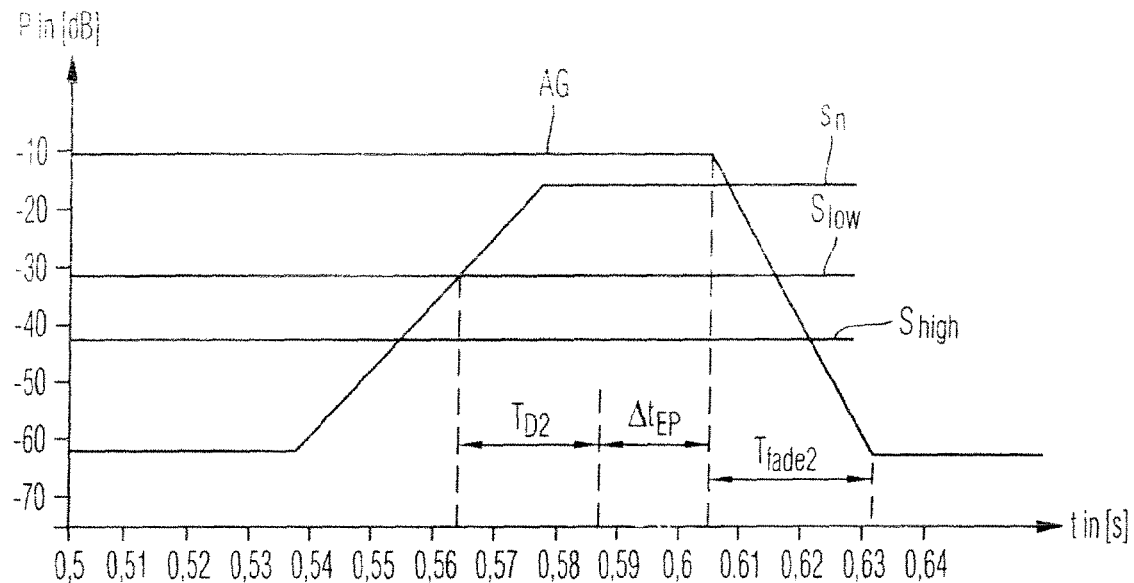
FIG. 11 is a time diagram of ending a gating of a receiving signal in a third embodiment of the invention.

In the third embodiment of the invention with fading from an active gating level down to zero inside a second fading time $T_{fade2}$ at the end of gating according to FIG. 11 the end point $EP_{G3}$ of gating corresponds to the end point $EP_{G2}$ of the second embodiment of the invention, if the start of fading defines the end point of gating.

Figure 12:
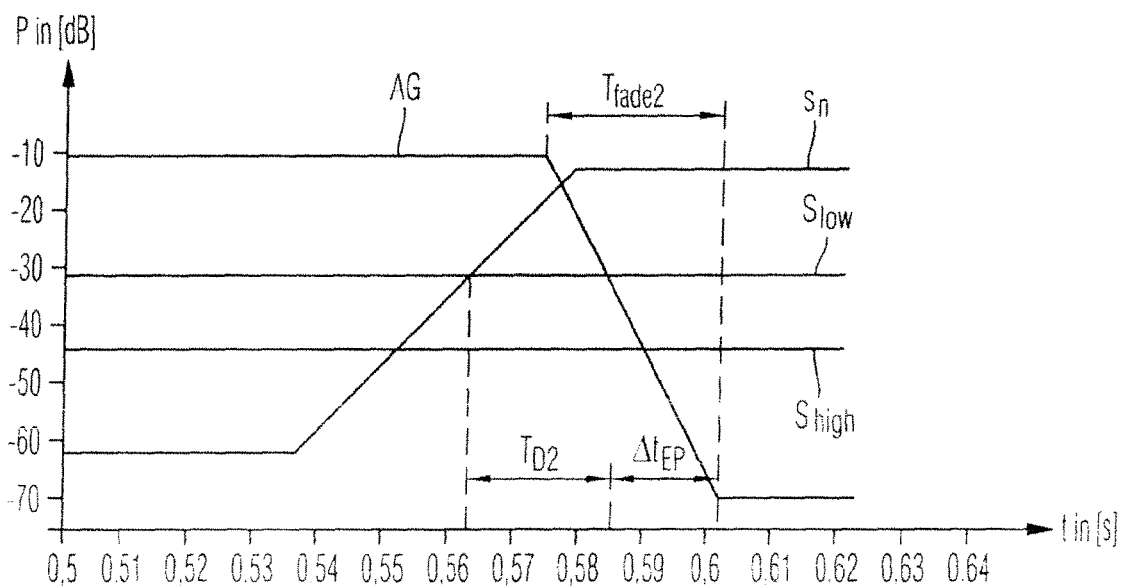
FIG. 12 is a time diagram of ending a gating of a receiving signal in a fourth embodiment of the invention.

According to FIG. 12 the end point $EP_{G4}$ of gating in the fourth embodiment of the invention corresponds to the end point $EP_{G2}$ of the second embodiment of the invention in addition to the second fading time $T_{fade2}$, if the end of fading defines the end point of gating.

In the following step S50 of the inventive method the third delay time $T_{D3}$ for delaying the sampled amplitudes $m_n$ of the received audio signal at the beginning of the gating and the fourth delay time $T_{D4}$ for delaying the sampled amplitudes $m_n$ of the received audio signal at the end of the gating are calculated.

The third delay time $T_{D3}$ at the beginning of the gating in the first embodiment of the invention calculates according to equation (2a):

$$T_{D3} \geq T_{D1} \tag{2a}$$

The third delay time $T_{D3}$ at the beginning of the gating in the second embodiment of the invention calculates according to equation (2b), whereby a positive value of the first time interval $\Delta t_{sp}$ corresponds to a start point $SP_{G2}$ of gating of the second embodiment of invention being earlier than the rising of the squelch signal $s_n$ above the higher threshold $S_{high}$:

$$T_{D3} \geq T_{D1} + \Delta t_{sp} \tag{2b}$$

The third delay time $T_{D3}$ at the beginning of the gating in the third embodiment of the invention calculates according to equation (2c), whereby a positive value of the first time interval $\Delta t_{sp}$ corresponds to a start point $SP_{G3}$ of gating of the third embodiment of invention being earlier than the rising of the squelch signal above the higher threshold $S_{high}$:

$$T_{D3} \geq T_{D1} + \Delta t_{sp} \tag{2c}$$

The third delay time $T_{D3}$ at the beginning of the gating in the fourth embodiment of the invention calculates according to equation (2d), whereby a positive value of the first time interval $\Delta t_{sp}$ corresponds to a start point $SP_{G4}$ of gating of the fourth embodiment of invention being earlier than the rising of the squelch signal $s_n$ above the higher threshold $S_{high}$:

$$T^{D3} \geq T_{D1} + \Delta t_{sp} - T_{fade1} \tag{2d}$$

The fourth delay time $T_{D4}$ at the end of the gating in the first embodiment of the invention calculates according to equation (3a):

$$T_{D4} \geq T_{D2} \tag{3a}$$

The fourth delay time $T_{D4}$ at the end of the gating in the second embodiment of the invention calculates according to equation (3b), whereby a positive value of the second time interval $\Delta t_{ep}$ corresponds to an end point $EP_{G2}$ of gating of the second embodiment of invention being earlier than the dropping of the squelch signal $s_n$ below the lower threshold $S_{low}$:

$$T_{D4} \geq T_{D2} + \Delta t_{ep} \tag{3b}$$

The fourth delay time $T_{D4}$ at the end of the gating in the third embodiment of the invention calculates according to equation (3c), whereby a positive value of the second time interval $\Delta t_{ep}$ corresponds to an end point $EP_{G3}$ of gating of the third embodiment of invention being earlier than the dropping of the squelch signal $s_n$ below the lower threshold $S_{low}$:

$$T_{D4} \geq T_{D2} + \Delta t_{ep} \quad (3c)$$

The fourth delay time $T_{D4}$ at the end of the gating in the fourth embodiment of the invention calculates according to equation (3d), whereby a positive value of the second time interval $\Delta t_{ep}$ corresponds to an end point $EP_{G4}$ of gating of the fourth embodiment of invention being earlier than the dropping of the squelch signal $s_n$ below the lower threshold $S_{low}$:

$$T_{D4} \geq T_{D2} + \Delta t_{ep} + T_{fade2} \quad (3d)$$

For delaying the sampled amplitudes $m_n$ of the received audio signal both at the beginning and also at the end of the gating the maximum delay time $T_{DMax}$ is chosen of the third delay time $T_{D3}$ at the beginning of the gating and of the fourth delay time $T_{D4}$ at the end of the gating in the next step S60 according to equation (4):

$$T_{DMax} = \max\{0; T_{D3}; T_{D4}\} \quad (4)$$

Figure 3:
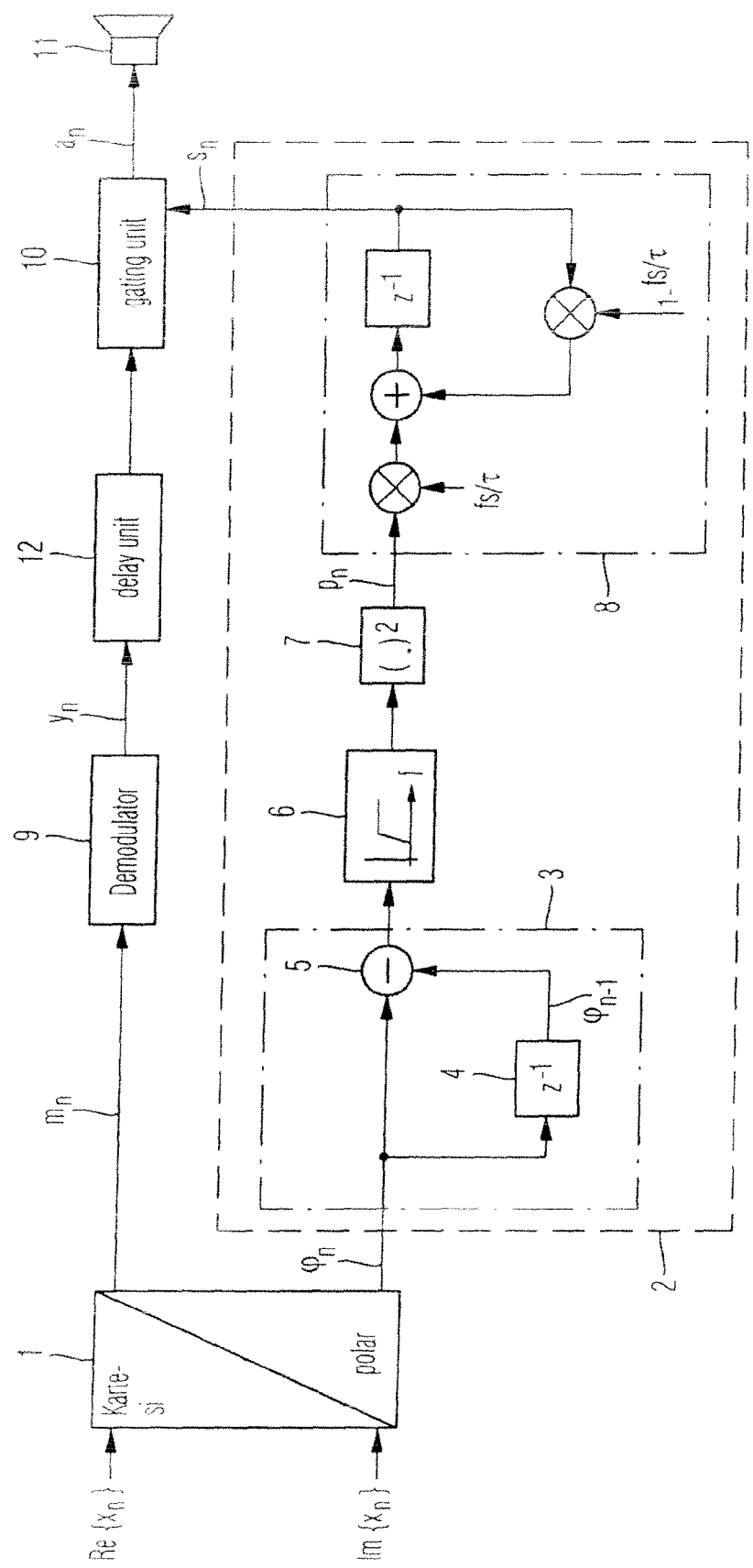
FIG. 3 is a block diagram of an inventive apparatus for gating a receiving signal.
Figure 4:
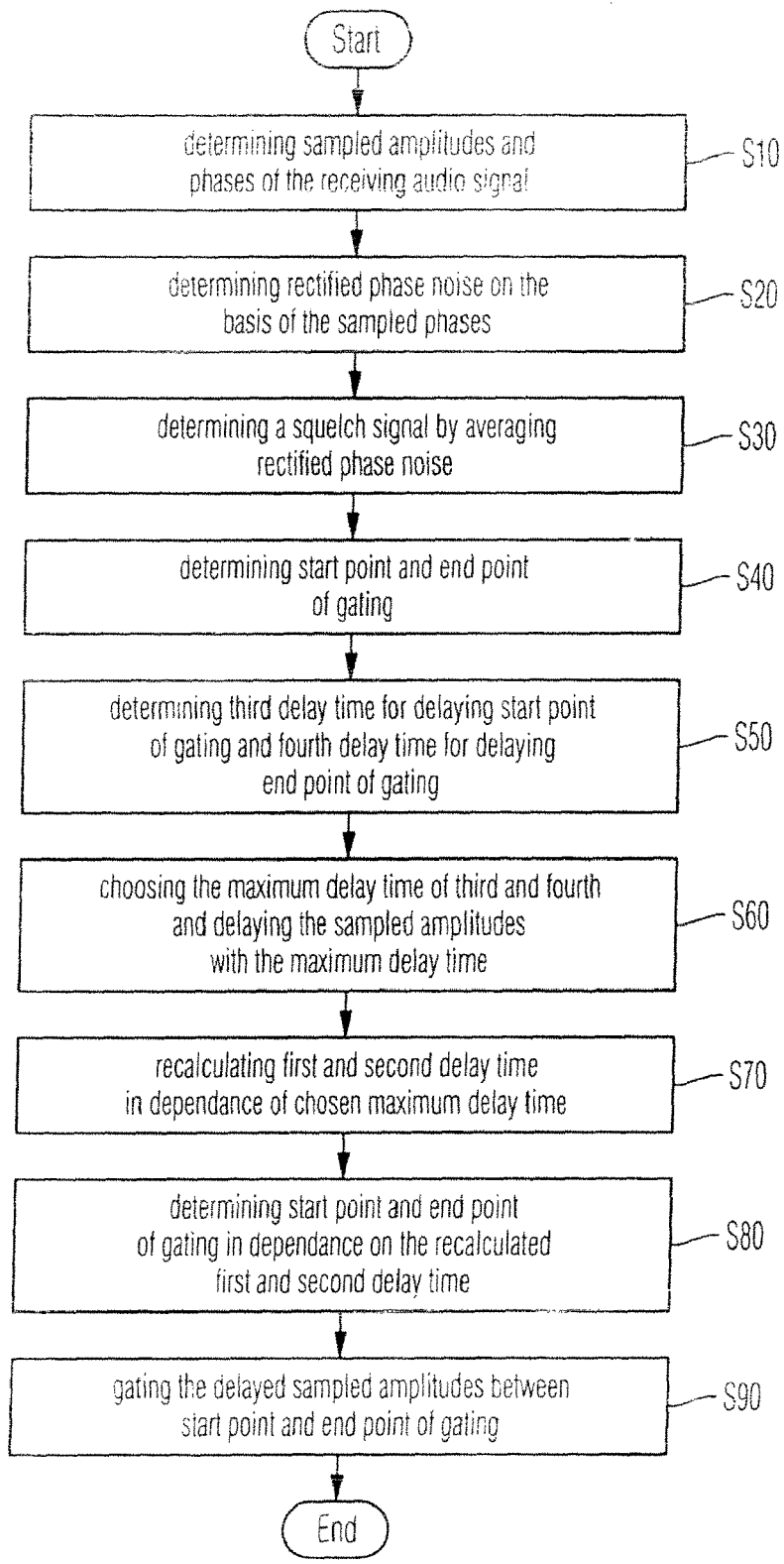
FIG. 4 is a flowchart of an inventive method for gating a receiving signal.

In step S60 the sampled amplitudes $m_n$ of the received audio signal are delayed in a delay unit 12 located between the demodulator 9 and the gating unit 10 in the inventive apparatus for gating a received signal according to FIG. 3 with the maximum delay time $T_{DMax}$.

The failure caused by choosing one delay time of the third delay time $T_{D3}$ or the fourth delay time $T_{D3}$ for the delay time $T_{DMax}$ applied for delaying the sampled amplitudes $m_n$ of the received audio signal both at the beginning and at the end of the gating is compensated in the next step S70 by recalculating the first delay time $T_{D1}$ and the second delay time $T_{D2}$:

For the first embodiment of the invention the first delay $T_{D2}$ is recalculated according to equation (5a) and the second delay time $T_{D2}$ is recalculated according to equation (6a):

$$T_{D1} = T_{DMax} \quad (5a)$$

$$T_{D2} = T_{DMax} \quad (6a)$$

For the second embodiment of the invention the first delay $T_{D1}$ is recalculated according to equation (5b) and the second delay time $T_{D2}$ is recalculated according to equation (6b):

$$T_{D1} = T_{DMax} - \Delta t_{sp} \quad (5b)$$

$$T_{D2} = T_{DMax} - \Delta t_{ep} \quad (6b)$$

For the third embodiment of the invention the first delay $T_{D1}$ is recalculated according to equation (5c) and the second delay time $T_{D2}$ is recalculated according to equation (6c):

$$T_{D1} = T_{DMax} - \Delta t_{sp} \quad (5c)$$

$$T_{D2} = T_{DMax} - \Delta t_{ep} \quad (6c)$$

For the fourth embodiment of the invention the first delay $T_{D1}$ is recalculated according to equation (5d) and the second delay time $T_{D2}$ is recalculated according to equation (6d):

$$T_{D1} = T_{DMax} - \Delta t_{sp} + T_{fade1} \quad (5D)$$

$$T_{D2} = T_{DMax} - \Delta t_{ep} + T_{fade2} \quad (6D)$$

By using the recalculated first delay time $T_{D1}$ according to one of the equations (5a) to (5d) and the second delay time $T_{D2}$ according to one of the equations (6a) to (6d) the new start point $SP_{G1}$, $SP_{G2}$, $SP_{G3}$, or $SP_{G4}$ of the first, second, third or fourth embodiment of the invention according to FIG. 5, 6, 7, or 8 and the end point $EPG_{G1}$, $EPG_{G2}$, $EPG_{G3}$, or $EPG_{G4}$ of the first, second, third or fourth embodiment of the invention according to FIG. 9, 10, 11, or 12 is determined in the next step S80.

In the last step S90 of the inventive method the delayed sampled amplitudes $m_n$ of the received audio signal are gated in the gating unit 10 between the start point $SP_{G1}$, $SP_{G2}$, $SP_{G3}$, $SP_{G4}$ in the first, second, third, or fourth embodiment of the invention and the end point $EP_{G1}$, $EP_{G2}$, $EP_{G3}$, or $EP_{G4}$ of the first, second, third, or fourth embodiment of the invention.

The invention is not limited to the embodiment of the inventive apparatus and to the four embodiments of the inventive method for gating a receiving signal specifically disclosed herein. The invention also covers other combinations of the embodiments of the inventive method, for example a level and time trigger of the squelch signal $s_n$ without using any user specific adjustment of the start point and/or end point of gating in combination with fading of the gating. Furthermore, nonlinear characteristic of fading—for example a squared fading characteristic—is also within the scope of the invention.

The invention claimed is:

1. Method for squelch gating a receiving signal depending on the level of phase noise in said receiving signal, said method comprising following steps:
    determining sampled amplitudes and sampled phases of said receiving signal,
    determining sampled phase noise by differentiating subsequent sampled phases,
    determining a squelch signal by rectifying and averaging said sampled phase noise,
    determining a start point of gating after a dropping of said squelch signal below a higher threshold delayed by a first delay time,
    determining an end point of gating after a rising of said squelch signal above a lower threshold delayed by a second delay time;
    selecting a first time interval relative to said rising of said squelch signal above said higher threshold for said start point of gating;
    selecting a second time interval relative to said dropping of said squelch signal below said lower threshold for said end point of gating;
    calculating a third delay time for delaying said sampled amplitudes at said start point of gating corresponding to the summation of said first time interval relative to said rising of said squelch signal above said higher threshold and said first delay time,
    calculating a fourth delay time for delaying said sampled amplitudes at said end point of gating corresponding to the summation of said second time interval relative to said dropping of said squelch signal below said lower threshold and said second delay time,
    whereby a maximum delay time of said first delay time and of said second delay time for delaying said sampled amplitudes is chosen and said first delay time and said second delay time is recalculated in the size of said chosen maximum delay time, and
    choosing the maximum delay time of said third delay time and of said fourth delay time for delaying said sampled amplitudes;
    gating said sampled amplitudes from said start point of gating until said end point of gating; and
    continuously increasing said gating from an inactive gating level up to an active gating level during a first fading time beginning at a start point of gating respective ending at a start point of gating and is continuously decreasing from said active gating level down to said inactive fading level during a second fading time beginning at an end point of gating respective ending at an end point of gating.

2. Method for gating a receiving signal according to claim 1, wherein that said first delay time corresponds to the difference between said chosen maximum delay time and said first time intervalrelative to said rising of said squelch signal above said higher threshold, and said second delay time corresponds to the difference between said chosen maximum delay time and said second time interval relative to said dropping of said squelch signal below said lower threshold.

3. Method for gating a receiving signal according to claim 1, comprising, in case of said rising squelch signal being below said higher threshold changing the value of said squelch signal is changed to the value of said higher threshold and in case of said dropping squelch signal being above said lower threshold changing the value of said squelch signal is changed to the value of said lower threshold.

4. Apparatus for squelch gating a receiving signal depending on the value of phase noise in said receiving signal comprising:

a unit for determining sampled amplitudes and sampled phases of said receiving signal, a unit for determining sampled phase noise by differentiating subsequent sampled phases, a unit for determining a squelch signal by rectifying and averaging said sampled phase noise, a unit for selecting a first time interval relative to said rising of said squelch signal above said higher threshold for said start point of gating;

a unit for selecting a second time interval relative to said dropping of said squelch signal below said lower threshold for said end point of gating;

a unit for calculating a third delay time for delaying said sampled amplitudes at said start point of gating corresponding to the summation of said first time interval relative to said rising of said squelch signal above said higher threshold and said first delay time, a unit for calculating a fourth delay time for delaying said sampled amplitudes at said end point of gating corresponding to the summation of said second time interval relative to said dropping of said squelch signal below said lower threshold and said second delay time, a switching unit for gating said sampled amplitudes from a dropping of said squelch signal below a higher threshold delayed by a first delay time until a rising of said squelch signal above a lower threshold delayed by a second delay time, whereby a maximum delay time of said first delay time and of said second delay time for delaying said sampled amplitudes is chosen and said first delay time and said second delay time is recalculated in the size of said chosen maximum delay time, a unit for choosing the maximum delay time of said third delay time and of said fourth delay time for delaying said sampled amplitudes, and a unit for continuously increasing said gating from an inactive gating level up to an active gating level during a first fading time beginning at a start point of gating respective ending at a start point of gating and is continuously decreasing from said active gating level down to said inactive fading level during a second fading time beginning at an end point of gating respective ending at an end point of gating.

5. Apparatus for gating a receiving signal according claim 4 further comprising a delay unit for delaying said sampled amplitudes, which is preceded said switching unit.

* * * * *

UNITED STATES PATENT AND TRADEMARK OFFICE
CERTIFICATE OF CORRECTION

PATENT NO. : 7,907,923 B2
APPLICATION NO. : 11/694433
DATED : March 15, 2011
INVENTOR(S) : Reiner Hausdorf et al.

It is certified that error appears in the above-identified patent and that said Letters Patent is hereby corrected as shown below:

On the Title Page:

Item (73), "Müchen" should be -- München --.

Item (30), "06007405" should be -- 06 007 405.1 --.

Item (30), 07000145" should be -- 07 000 145.8 --.

Signed and Sealed this
Twenty-eighth Day of February, 2012

David J. Kappos
*Director of the United States Patent and Trademark Office*